United States Patent [19]
Fang

[11] Patent Number: 6,009,019
[45] Date of Patent: Dec. 28, 1999

[54] REAL TIME DRAM ELIMINATING A PERFORMANCE PENALTY FOR CROSSING A PAGE BOUNDARY

[75] Inventor: Hong-Gee Fang, Los Altos, Calif.

[73] Assignee: S3 Incorporated, Santa Clara, Calif.

[21] Appl. No.: 09/019,345

[22] Filed: Feb. 5, 1998

[51] Int. Cl.⁶ .................................................. G11C 8/00
[52] U.S. Cl. .......................... 365/189.02; 365/230.02; 711/5
[58] Field of Search ............................. 365/230.03, 235, 365/189.02, 238.5; 711/5, 105

[56] References Cited

U.S. PATENT DOCUMENTS

| | | | |
|---|---|---|---|
| 4,823,324 | 4/1989 | Taylor et al. ....................... | 365/230.03 |
| 4,831,522 | 5/1989 | Henderson et al. ..................... | 711/2 |
| 4,918,645 | 4/1990 | Lagoy, Jr. ............................... | 711/151 |
| 5,063,497 | 11/1991 | Cutler et al. ........................ | 395/800.06 |
| 5,155,826 | 10/1992 | Fadem ..................................... | 711/209 |
| 5,285,421 | 2/1994 | Young et al. ....................... | 365/230.04 |
| 5,289,413 | 2/1994 | Tsuchida et al. .................. | 365/189.02 |
| 5,390,354 | 2/1995 | de Heus et al. ........................ | 707/517 |
| 5,440,710 | 8/1995 | Richter et al. .......................... | 711/207 |
| 5,485,428 | 1/1996 | Lin ......................................... | 365/221 |
| 5,551,054 | 8/1996 | Packer ..................................... | 710/23 |

*Primary Examiner*—David L. Robertson
*Attorney, Agent, or Firm*—Fenwick & West LLP

[57] ABSTRACT

A memory system allows page boundaries to be crossed in successive reads of a Dynamic Random Access Memory (DRAM) without the necessity of waiting for another page of memory to be read out of a memory array of the DRAM. The memory is divided into multiple banks, each of which has a Bit-Line Sense Amplifier (BLSA) capable of holding one page of memory. Successive pages of memory are stored in separate banks, and may be activated or deactivated while data from another page is being read. The memory system is operable whether the successive reads are sequential or out-of-order.

30 Claims, 4 Drawing Sheets

| Bank | Row | Page |
|---|---|---|
| Bank 1 | Row1 | Page 1 |
| Bank 2 | Row1 | Page 2 |
| Bank 3 | Row1 | Page 3 |
| ... | ... | ... |
| Bank N | Row1 | Page N |
| Bank 1 | Row 2 | Page N+1 |
| Bank 2 | Row2 | Page N+2 |
| Bank 3 | Row2 | Page N+3 |
| ... | ... | ... |
| Bank N | Row2 | Page 2*N |
| Bank 1 | Row 3 | Page 2*N+1 |
| ... | ... | ... |
| ... | ... | ... |
| Bank N | Row M | Page N*M |

Memory map sequential addresses

REAL TIME DRAM ELIMINATING A PERFORMANCE PENALTY FOR CROSSING A PAGE BOUNDARY

FIELD OF THE INVENTION

This invention pertains to the field of high-speed dynamic random access memory systems. More specifically, this invention pertains to the use of multiple dynamic random access memory banks in such a manner as to reduce or eliminate performance penalties encountered when crossing a page boundary.

BACKGROUND OF THE INVENTION

Dynamic Random Access Memories (DRAMs) are commonly used in digital computers to store data. DRAMs have significantly greater storage density than Static Random Access Memories (SRAMs) but operate at slower speeds than SRAMs.

A number of techniques have been developed to improve the access time of memory systems employing DRAM chips. A common technique is the use of page mode addressing which exploits the internal organization of the DRAM. Specifically, typical DRAM chips employ a storage array organized in rows (also known as "pages") and columns. Presentation of a row address causes access of an entire row, which includes a plurality of columns, to a Bit-Line Sense Amplifier (BLSA). Presentation of a column address then causes selection and output from the chip of a column comprising one or more bits. The row access typically is the significant limiting factor in a data access from a DRAM. Once the row access is performed, multiple column accesses may be performed to implement the aforesaid page mode operation.

Page mode operation provides significant increases in the speed of reading from and writing to a DRAM. However, such an increase only occurs so long as all accesses are within a particular row, or page. Whenever an access occurs across a row/page boundary, a performance penalty is incurred. What is needed is a system whereby a performance penalty is not necessarily incurred when an access occurs which crosses a row/page boundary.

SUMMARY OF THE INVENTION

The present invention allows for the paging of DRAM without necessarily incurring a performance penalty when the boundary of a page is crossed.

In accordance with the principles of the present invention, a memory is organized into several banks, such that a sequential read of memory will begin with a page from one bank, and continue to a page located in another bank. Contiguous pages of memory are not located within the same memory bank.

In certain embodiments, each bank is associated with a Bit-Line Sense Amplifier (BLSA) capable of holding one page of data from the bank. When an access of a given bit occurs, the BLSA corresponding to the bank containing the accessed bit is filled with data from the page containing the bit. Additionally, at the same time that the BLSA associated with the accessed bank is filled, the BLSAs associated with certain other banks are filled with data from pages likely to be accessed soon. As accesses continue from the same page as the initial access, the accesses occur from the same BLSA. When the accesses move across a page boundary to another bank, the new access occurs directly from the BLSA associated with that bank, if that BLSA is already filled with the correct page. At the time that the crossing of a page boundary occurs, a previously empty BLSA may be filled with data from another page, and one of the filled BLSAs may be released. A significant advantage is that a fixed number of BLSAs may always be prepared to be accessed, and an access which crosses a page boundary will often not need to wait for the filling of a BLSA.

These and other features and advantages of the present invention may be better understood by considering the following detailed description of preferred embodiments of the invention. In the course of this description, reference will frequently be made to the attached drawings.

DETAILED DESCRIPTION OF THE PREFERRED EMBODIMENTS

Figure 1:
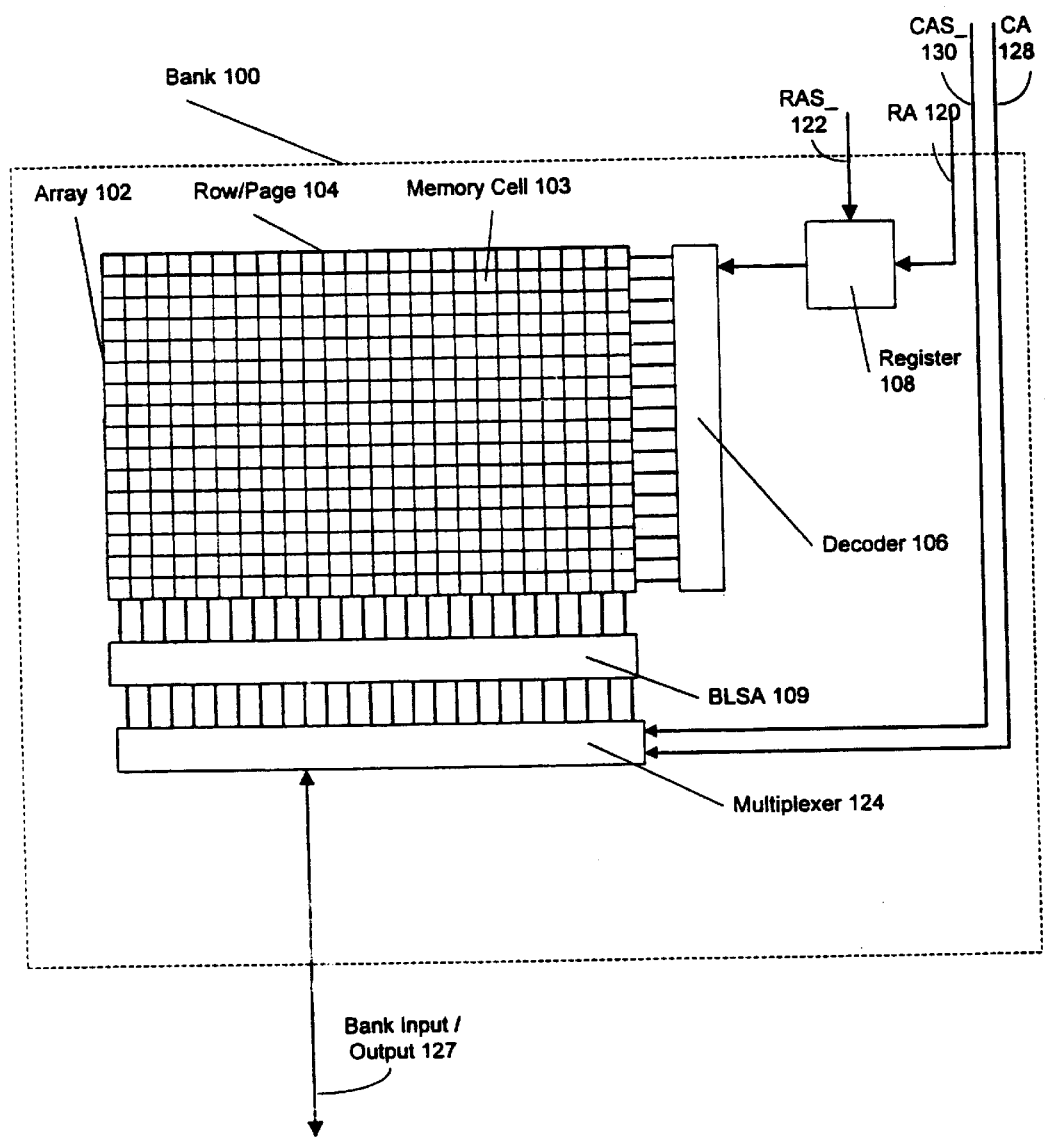
FIG. 1 is an illustration of a conventional memory structure.

FIG. 1 illustrates a conventional DRAM storage and accessing structure 100 which includes storage array 102, row address decoder 106, row address register 108, Bit-Line Sense Amplifier (BLSA) 109, and column multiplexer/selector 124. The storage array 102 consists of a plurality of conventional DRAM type storage cells 103 organized in a plurality of rows and columns. Each row is referred to herein as a "page."

Figure 2:
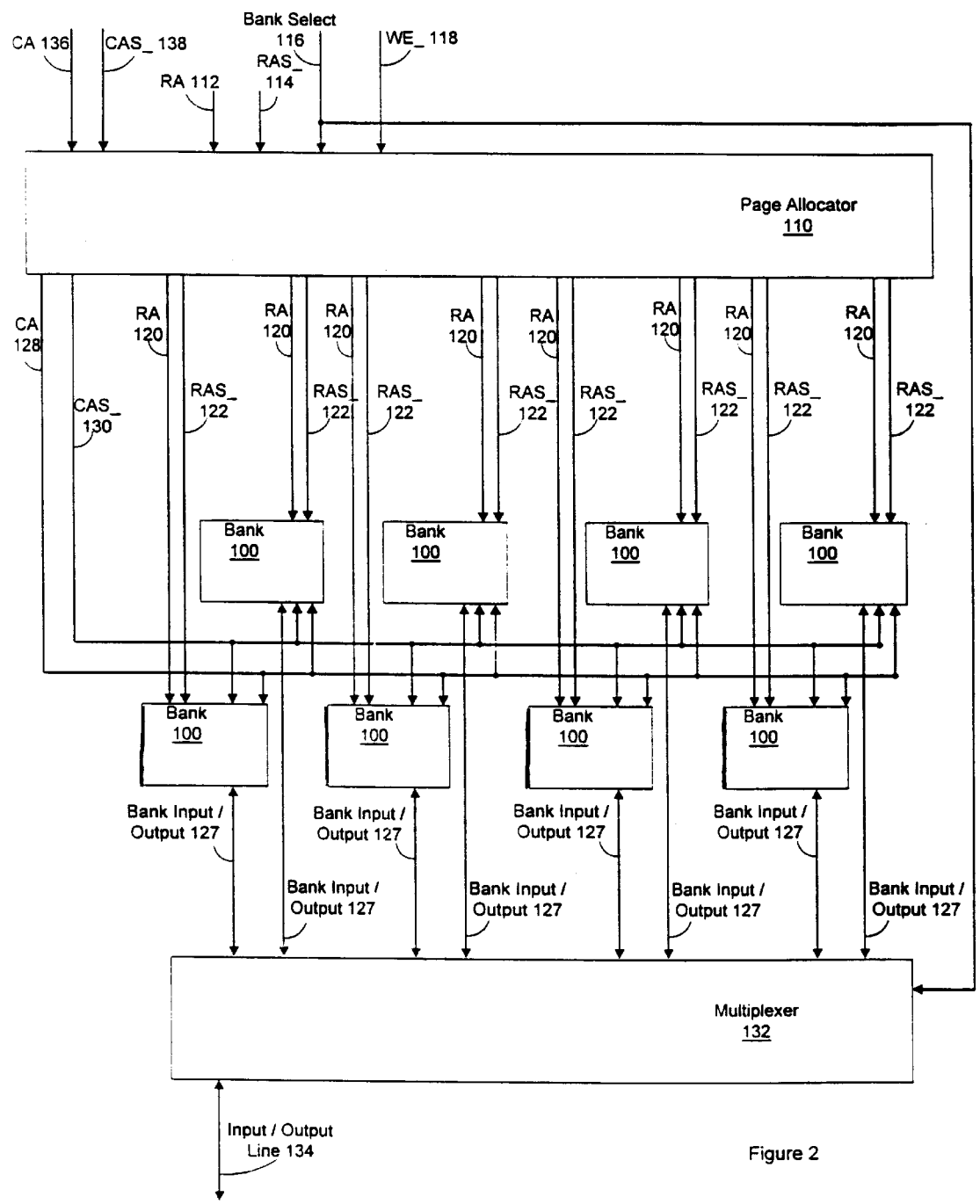
FIG. 2 is a block diagram of a preferred embodiment.

Data stored in storage array 102 is accessed by presenting a row address via row address (RA) line 120 and providing a Row Address Strobe (RAS_ via RAS_line 122. The row address is latched into register 108 by setting RAS_line 122 low. The row address which is latched into register 108 is decoded by row address decoder 106 which causes data stored in one of the pages, such as page 104, to be transferred to BLSA 109, which operates conventionally to amplify and store the data in the selected page. Data in the selected page is then selected in quantities of one bit or more by way of a Column Address (CA) provided via CA line 128, and a Column Address Strobe (CAS_ 130. Write operations operate similarly with the additional use of a Write Enable (WE_) signal (not shown) which indicates to the appropriate circuitry in structure 100 (such as BLSA 109) that a write operation is taking place. In FIG. 1, the RAS_, CAS_and WE_signals are each designated as active low signals. FIG. 2 of the drawings illustrates a preferred embodiment which employs a plurality of structures 100 (also referred to herein as "banks"). A page allocator 110 accepts input lines for column address (CA) 136, column address strobe (CAS_ 138, row address (RA) 112, row address strobe (RAS_114, a bank select signal 116, and a Write Enable (WE_) signal 118. In the embodiment shown in FIG. 2, the RAS_, CAS_and WE_signals are each designated as active low signals. By way of example, CA 136 is thirteen bits wide, RA 112 is eight bits wide, and bank select 116 is three bits wide. In the embodiment of FIG. 2, output from page allocator 110 takes the form of eight RA lines 120, eight RAS_lines 122, a CA 128 line and a CAS_130 line. One RA 120 and one RAS_122 are connected to each of the eight registers 108 (shown in FIG. 1), and CA 128 and CAS_130 lines are connected to all eight multiplexers 124 (shown in FIG. 1). When a read is to take place, WE_line 118 is high, and when a write is to take place, WE_line 118 is low. RAS_122 is held low to activate a page of memory, and the page which is transferred to the associated BLSA is held in the BLSA while RAS_122 is held low. A bank is in an "active state" when a page of memory is held in the BLSA associated with that bank. A bank is in an "inactive state" when the BLSA associated with the bank is not holding a page of memory.

Figure 3:
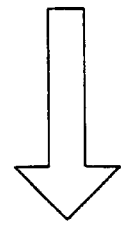
FIG. 3 is a diagram showing the location of sequential pages of memory in one exemplary embodiment of the invention.

FIG. 3 illustrates the manner in which the banks 100 in the embodiment of FIG. 2 are addressed. Memory stored in the banks 100 is organized such that a sequential read of pages begins with the first row of the first bank, and continues to the first row of the second bank. This continues through the first row of the last bank, then to the second row of the first bank. The first row of each bank is read before the second row of any bank, and the second row of every bank is read before the third row of any bank. This pattern is followed through the last row of the last bank.

Figure 4:
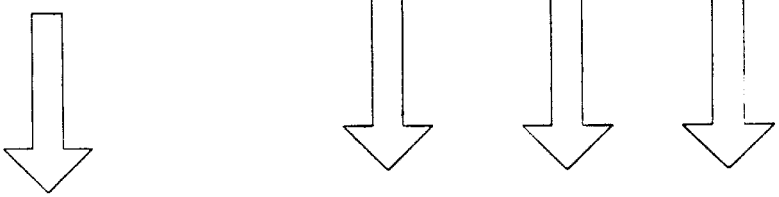
FIG. 4 is a diagram showing the combinations of pages stored in BLSA memory for a number of cases relating to the exemplary embodiment.

Turning to FIG. 2, in the context of a read operation, a bank from which a read is to take place (referred to herein as the "addressed bank") is indicated by bank select line 116, the page containing the requested data (referred to herein as the "addressed page") is indicated by the row address of RA line 112, and RAS_114 is held low. The page allocator 110 passes the row address over the RA line 120 connected to the addressed bank, and sets the RAS_line 122 connected to that bank 100 low. The page allocator 110 also specifies a row address on RA lines 120 for other banks to be set in the active state (referred to herein as "additional banks"), and sets these associated RAS_lines 122 low. In the exemplary embodiment of FIG. 2, there are a total of four banks which receive RA and RAS_signals. The three additional banks selected are the two banks holding the two pages sequentially following the addressed page, and the bank holding the page sequentially preceding the addressed page. In general, these additional banks include the bank immediately preceding and the two banks immediately following the addressed bank, as shown in case A of FIG. 4. If the addressed bank is the first bank, then the sequentially preceding page is in the last bank, as shown in case B. Similarly, if the addressed bank is the last bank, as shown in case C, the following pages will be in the first two banks.

The four banks 100 selected by the page allocator 110 each load a single page into the associated BLSA 109. In the exemplary embodiment, these four pages are sequential, with the addressed bank being present in the second of the four sequential pages. The page allocator 110 then transmits the column address over the CA 128 line and sets CAS_130 low. These lines are connected to multiplexer 124, which uses the column address to select the column from BLSA 109 holding the data indicated by RA 112, CA 136 and bank select 116. This data is output to multiplexer 132 via bank input/output line 127. The bank select line 116 is input to the multiplexer 132, and determines which data from the four active BLSAs 109 will be selected for transmission on the input/output line 134.

When another read occurs, the page allocator determines whether the requested data is within one of the four pages of memory currently available in the four active BLSAs 109. If it is within one of the active pages, no read is required of the arrays 102, and the requested data can be read directly from the BLSA 109 of the correct bank 100, which takes less time than reading from the array 102. This is accomplished by setting CA line 128 to the column of CA line 136, and setting the CAS_line 130 low. The appropriate data is transmitted to the multiplexer 132, where the bank select line 116 will cause it to be selected and transmitted to the input/output line 134. If the data indicated by RA 112, CA 136 and bank select 116 is in the third or fourth active pages, the set of active pages is adjusted so that once again there will be four sequential pages available in the BLSAs 109, with the addressed page being the second of these four pages. This adjustment is made by the page allocator 110 by releasing pages no longer needed and activating new pages which are needed. Pages are released by setting the associated RAS_line 122 high, and pages are activated by putting the correct row address on the RA line 120 to those banks, and setting the associated RAS_lines 122 low. Because the data indicated by RA 112, CA 136 and bank select 116 is already present in one BLSA 109, however, this changing of the active pages can occur in parallel with the reading of data, so no performance penalty is necessarily incurred by crossing a page boundary. As long as a read is for data in a page which is stored in one of the four active BLSAs 109, that read can be accomplished in the shorter period required of reads from the BLSAs 109. If the read is not for data present in one of the active pages, then the read may not be accomplished until after the new set of active pages are loaded into the active BLSAs 109. By updating the active pages while reads are being carried out from the BLSAs 109, reads may be accommodated indefinitely without the performance penalty conventionally associated with crossing a page boundary, as long as successive reads are not outside the range of the active pages.

The above description is included to illustrate the operation of an exemplary embodiment and is not meant to limit the scope of the invention. The scope of the invention is to be limited only by the following claims. From the above description, many variations will be apparent to one skilled in the art that would be encompassed by the spirit and scope of the present invention.

What is claimed is:

1. A memory system, comprising:
   a) a plurality of memory banks having active and inactive states, each of the memory banks including:
      a plurality of pages, each page including a plurality of dynamic random access memory cells, and
      a page storage device coupled the plurality of pages, disposed to store data from the memory cells of one page while the memory bank is active;
   b) a page allocator, coupled to the plurality of memory banks, for:
      determining in response to a signal corresponding to an addressed page a set of at least two pages including the addressed page, such that every page in the set of pages is contained in a different memory bank from every other page in the set of pages,
      deactivating any active memory bank which does not contain a page in the set of pages, and
      activating any inactive memory bank which contains a page in the set of pages; and
   c) a bank multiplexer coupled to the bit-line sense amplifiers of the plurality of memory banks responsive to a bank address, for selecting one of the pages in the page storage device corresponding to the pages in the set.

2. The memory system of claim 1, wherein:
   the plurality of memory banks are each disposed to accept a page address and place into the page storage device data from the page which corresponds to the page address; and the page allocator sends the page address of each page in the set of pages to the memory bank which contains the page.

3. The memory system of claim 2, wherein:

all pages in the set of pages are mapped to contiguous memory addresses by an associated memory map.

4. The memory system of claim 3, wherein:

the page allocator determines the set of pages with reference to any active memory banks.

5. The memory system of claim 1, wherein:

all pages in the set of pages are mapped to contiguous memory addresses by an associated memory map.

6. The memory system of claim 5, wherein:

the page allocator determines the set of pages with reference to any active memory banks.

7. The memory system of claim 1, wherein:

the page allocator determines the set of pages with reference to any active memory banks.

8. The method of claim 1, wherein the set of at least two pages excludes at least one page having a same row address as the addressed page.

9. The method of claim 1, wherein the set of at least two pages consists only of the page prior to the addressed page and the two pages subsequent to the addressed page.

10. The method of claim 1, wherein the set of at least two pages has a number of members fewer than the number of plurality of memory banks.

11. The method of claim 1, wherein the set of at least two pages includes a page in a first memory bank and a page in a last memory bank and wherein the set of at least two pages does not include a page in at least one memory bank.

12. A memory system, comprising:
  a) a plurality of memory banks having active and inactive states, each of the memory banks including:
    an array of dynamic random access memory cells, the array including a plurality of pages,
    a bit-line sense amplifier comprising a plurality of columns, coupled to the array, for storing a page of data from the array,
    a page address decoder coupled to the array, responsive to a page address for selecting one of the plurality of pages such that the data contained in the selected page is transferred to the bit-line sense amplifier, and
    a column address multiplexer coupled to the bit-line sense amplifier, responsive to a column address for selecting one of the plurality of columns of the bit-line sense amplifier;
  b) a page allocator coupled to the page address decoder of each of the memory banks, disposed to accept an input signal corresponding to an addressed page, for:
    determining a set of at least two pages such that the addressed page is included in the set and each page in the set is contained in a different memory bank, and
    sending the page address of each page in the set to the page address decoder of the memory bank which contains the page: and
  c) a bank multiplexer coupled to the bit-line sense amplifiers of the plurality of memory banks responsive to a bank address, for selecting one of the pages in the bit-line sense amplifier corresponding to the pages in the set.

13. The memory system of claim 12, wherein:

the pages of the memory banks conform to a sequence ordered such that each page in the sequence is contained in a different memory bank from the immediately preceding page in the sequence; and the set of pages includes any page which immediately precedes the addressed page according to the sequence.

14. The memory system of claim 12, wherein:

the pages of the memory banks conform to a sequence ordered such that each page in the sequence is contained in a different memory bank from the immediately preceding page in the sequence; and the set of pages includes any page which immediately follows the addressed page according to the sequence.

15. The memory system of claim 12, wherein:

the pages of the memory banks conform to a sequence ordered such that each page in the sequence is contained in a different memory bank from the immediately preceding page in the sequence; and the set of pages includes any page which immediately follows the addressed page in the sequence, and any page which immediately follows the page which immediately follows the addressed page according to the sequence.

16. The memory system of claim 12, wherein:

the pages of the memory banks conform to a sequence ordered such that each page in the sequence is contained in a different memory bank from the immediately preceding page in the sequence; and the set of pages includes,
  any page which immediately precedes the addressed page according to the sequence;
  any page which immediately follows the addressed page according to the sequence; and
  any page which immediately follows the page which immediately follows the addressed page according to the sequence.

17. The memory system of claim 12, wherein:

the pages of the memory banks conform to a sequence ordered such that each page in the sequence is contained in a different memory bank from the immediately preceding page in the sequence; and the pages in the set of pages are contiguous according to the sequence.

18. The memory system of claim 12, wherein the set of at least two pages excludes at least one page having a same row address as the addressed page.

19. The memory system of claim 12, wherein the set of at least two pages consists only of the page prior to the addressed page and the two pages subsequent to the addressed page.

20. The memory system of claim 12, wherein the set of at least two pages has a number of members fewer than the number of plurality of memory banks.

21. The memory system of claim 12, wherein the set of at least two pages includes a page in a first memory bank and a page in a last memory bank and wherein the set of at least two pages does not include a page in at least one memory bank.

22. A method of accessing memory in a plurality of memory banks having active and inactive states, each memory bank comprising a plurality of pages, the method comprising:

determining in response to a signal corresponding to an addressed page a set of at least two pages including the addressed page, the set of at least two pages having a number of members fewer than the number of plurality of memory banks;

deactivating any active memory bank which does not contain a page in the set of at least two pages; and activating any inactive memory bank which contains page in the set of at least two pages.

23. The method of claim 22, wherein:

every page in the set of pages is contained in a different memory bank from the other pages in the set of pages.

24. The method of claim 23, wherein the plurality of memory banks are each disposed to accept a page address while active and place the page corresponding to the page address in an associated page storage memory, and the method further comprises supplying the page address of each page in the set of pages to the memory bank which contains the page.

25. The method of claim 24, wherein the set of at least two pages is determined with reference to any active memory banks.

26. The method of claim 24, wherein the set of at least two pages is determined with reference to the pages in the page storage memories associated with any active memory banks.

27. The method of claim 22, wherein the set of at least two pages is determined with reference to any active memory banks.

28. The method of claim 22, wherein the set of at least two pages excludes at least one page having a same row address as the addressed page.

29. The method of claim 22, wherein the set of at least two pages consists only of the page prior to the addressed page and the two pages subsequent to the addressed page.

30. The method of claim 22, wherein the set of at least two pages includes a page in a first memory bank and a page in a last memory bank and wherein the set of at least two pages does not include a page in at least one memory bank.

* * * * *